(12) United States Patent
Bhardwaj et al.

(10) Patent No.: US 6,952,172 B1
(45) Date of Patent: Oct. 4, 2005

(54) ALL-OPTICAL LINEAR FEEDBACK SHIFT REGISTER

(75) Inventors: Ashish Bhardwaj, Eatontown, NJ (US); James J. Jaques, Metuchen, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/804,321

(22) Filed: Mar. 19, 2004

(51) Int. Cl.[7] ............................................. H03M 1/22
(52) U.S. Cl. ...................... 341/13; 398/131; 359/344
(58) Field of Search ................ 341/13, 14; 333/331, 333/239, 108, 344; 398/101, 178, 157, 131, 398/123, 164

(56) References Cited

U.S. PATENT DOCUMENTS 5,208,705 A * 5/1993 Avramopoulos et al. .... 398/154
5,315,422 A * 5/1994 Utaka et al. ................. 359/107
6,522,462 B2 * 2/2003 Chu et al. .................... 359/344

* cited by examiner

*Primary Examiner*—John B Nguyen

(57) ABSTRACT

An all-optical linear feedback circuit for use, for example, as a maximal length pseudo random bit sequence generator includes an all-optical logic circuit that is capable of generating $2^N-1$ bit maximal length pseudo random bit sequences on an optical channel at high data rates e.g. 80 Gbit/s. In the pseudo random bit sequence generator of the present invention, intensity-dependent phase modulation of at least one included semiconductor optical amplifier (SOA) is implemented. The maximum data rate is limited by the fast gain recovery time of the carriers in the SOA. An optical logic gate of the pseudo random bit sequence generator of the present invention may be constructed using various nonlinear elements that provide ultra-fast intensity-dependent phase modulation.

25 Claims, 5 Drawing Sheets

ALL-OPTICAL LINEAR FEEDBACK SHIFT REGISTER

STATEMENT OF GOVERNMENTAL INTEREST

This invention was made with Government support pursuant to Contract No. MDA904-03-C-0413 awarded by the National Security Agency. The Government has certain rights in the invention.

FIELD OF THE INVENTION

This invention relates to linear feedback circuits and, more specifically, to an all-optical linear feedback circuit.

BACKGROUND OF THE INVENTION

The use of linear feedback shift registers (LFSRs) is well known in integrated circuit technology. LFSRs may be used in a number of applications. For example, a LFSR may be used to implement a clock divider circuit. A clock divider circuit is used to divide a master clock signal to obtain a different frequency clock signal. A LFSR (n bit width) may also be used as both a test data generation circuit and a test result generation circuit. A LFSR serving as a test data generation circuit typically includes a simple register circuit including serial-connected n D-type flip-flops and a feedback circuit for generating an exclusive-OR (XOR) signal of outputs of predetermined flip-flops and supplying the signal to an input terminal of a first one of the serially-connected flip-flops.

LFSR circuits as described above are further implemented for data encryption. More specifically, data encryption techniques are used to increase the security in data exchange and transfer over a shared transmission channel. In its simplest form, data encryption uses a "key" based on a particular algorithm to change the sequence of a package of data that contains a piece of confidential information ("plaintext") so that the data is enciphered or "scrambled" into an form that appears to have no correlation with the embedded confidential information ("ciphertext"). An unauthorized user, who does not have the knowledge of either the encryption method (e.g., the encryption algorithm) or the key formed based on the encryption method, cannot easily in the scrambled data by using a "key" that is constructed based on the encryption method. Therefore, even if the unauthorized user obtains the scrambled data, the knowledge of both of the encryption method and the particular key is needed to decrypt the confidential information embedded therein.

One well-known encryption technique using LFSRs is the generation of maximal length pseudo random bit sequences (PRBS). Currently, however, PRBS generation and other similar known encryption systems and techniques are at most capable of encryption and decryption at rates of substantially 1 GBit/sec. Furthermore, current PRBS generating systems implementing LFSRs have large form factors and include relatively expensive components. However, as information exchange and transfer rates of communication systems increase, so does the need for encryption systems that are capable of encryption at compatible rates. In addition, with available component space in communication systems decreasing, there is also a need for encryption systems of smaller sizes and of decreased cost.

SUMMARY OF THE INVENTION

The present invention solves the deficiencies of the prior art by providing an all-optical linear feedback circuit that is capable of generating $2^N-1$ bit maximal length PRBS sequences at high data rates implementing an optical semiconductor amplifier.

In one embodiment of the present invention an all-optical linear feedback circuit includes a first optical logic circuit, a second optical logic circuit and a delay circuit. The first optical logic circuit includes at least a first input for receiving a first clocking signal for determining the data-rate of the all-optical linear feedback circuit, a second input for receiving a trigger signal, a third input for receiving a feedback signal, at least two optical paths and an output coupler for providing a Boolean logic output of a combination of the signals propagating in the at least two optical paths. At least one of the optical paths of the first optical logic circuit includes a nonlinear element for imparting an intensity-dependent phase modulation on a combined signal propagating therein, where a first portion of the first clocking signal and the trigger signal are combined and propagate along a first one of the at least two optical paths, and a second portion of the first clocking signal and the feedback signal are combined and propagate along a second one of the at least two optical paths.

The delay circuit of the all-optical linear feedback circuit of the present invention also includes at least two optical paths, where at least one of the at least two optical paths includes an optical delay element. The output of the first optical logic circuit is split and propagates along each of the at least two optical paths of the delay circuit and experiences a delay in the optical path of the delay circuit having the delay element.

The second optical logic circuit includes at least a first input for receiving a second clocking signal, a second input for receiving a signal from a first optical path of the at least two optical paths of the delay circuit, a third input for receiving a delayed signal from a second optical path of the at least two optical paths of the delay circuit, the second optical path including the delay element, at least two optical paths, and an output coupler for providing a Boolean logic output of a combination of the signals propagating in the at least two optical paths of the second logic circuit. Each of the optical paths of the second optical logic circuit includes at least one nonlinear element for imparting an intensity-dependent phase modulation on a combined signal propagating therein, where a first portion of the second clocking signal and the signal from the second input are combined and propagate along a first one of the at least two optical paths of the second logic circuit, and a second portion of the clocking signal and the signal from the third input are combined and propagate along a second one of the at least two optical paths of the second logic circuit. The output of the second logic circuit functions as the feedback signal received by the first logic circuit.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Although various embodiments of the present invention are being depicted herein with respect to an all-optical linear feedback circuit used for generating a maximal length pseudo random bit sequence (PRBS), the specific embodiments of the present invention should not be treated as limiting the scope of the invention. It will be appreciated by one skilled in the art informed by the teachings of the present invention that an all-optical linear feedback circuit in accordance with the present invention may be applied in substantially any application that a conventional linear feedback circuit may be applied. For example, an all-optical linear feedback circuit of the present invention may be implemented as a clock divider circuit, a test data generation circuit and a test result generation circuit.

$2^N-1$ bit maximal length pseudo random bit sequence (PRBS) generation is typically accomplished using N shift registers and an EXOR (exclusive-OR) operation. This is true for all cases of N that allow the maximal length PRBS generation using only two taps and one EXOR operation. An EXOR operation is performed on taps of a shift-register, the values of which are different for different values of N. For example, for N=31, an EXOR operation of the $3^{rd}$ bit (or the $28^{th}$ bit) and the $31^{st}$ bit of the shift register is performed to achieve maximal length PRBS generation. Typically, the outcome of the EXOR operation is fed back to the very first bit of the shift register.

Figure 1:
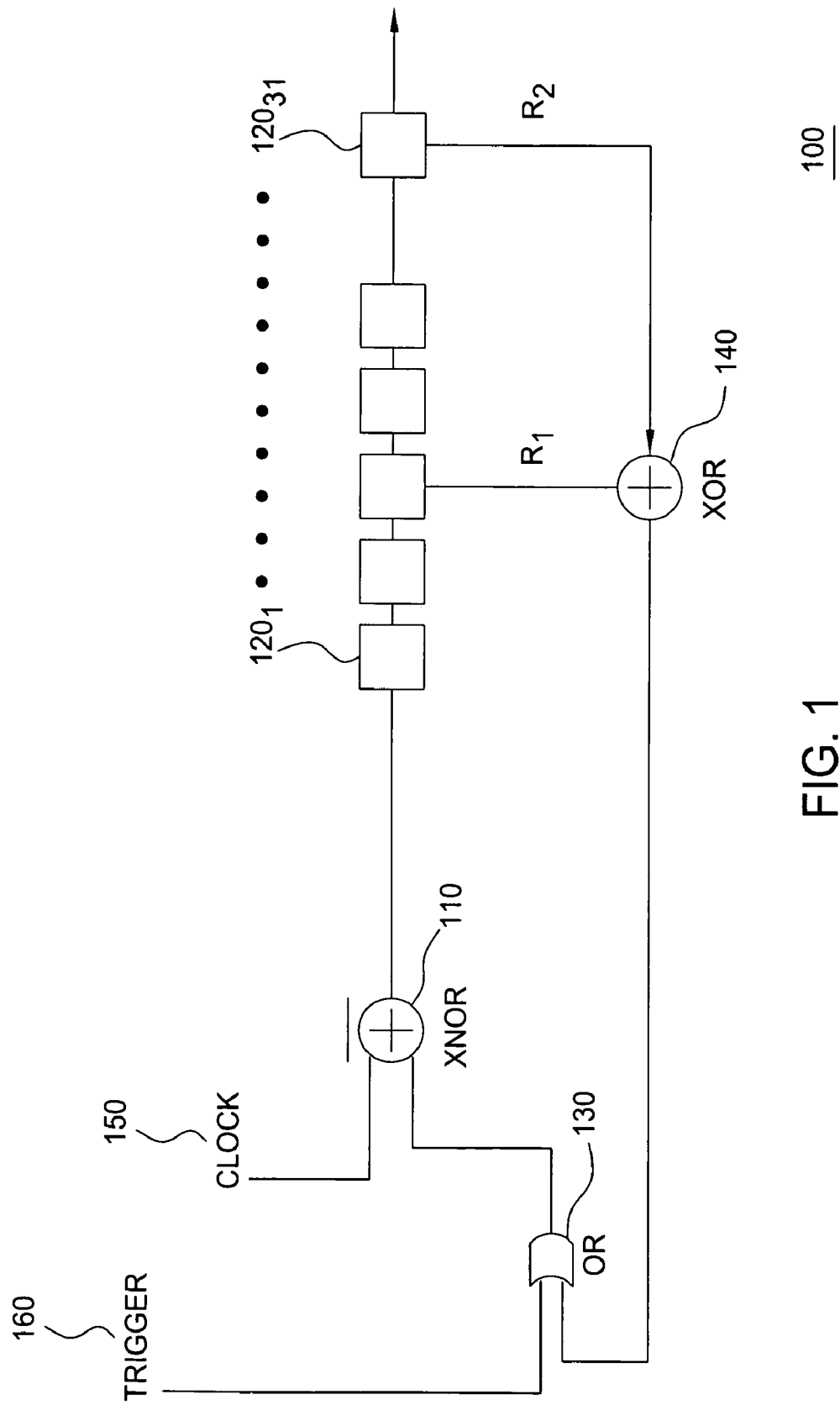
FIG. 1 depicts a high level block diagram of the Boolean logic for an embodiment of a PRBS generator in accordance with an embodiment of the present invention.

FIG. 1 depicts a high level block diagram of the Boolean logic for an embodiment of a PRBS generator in accordance with an embodiment of the present invention for N=31. The representative logic circuit 100 of FIG. 1 illustratively comprises an exclusive-Nor (XNOR) logic gate 110, a plurality of shift registers (illustratively 31 shift registers) $120_1$–$120_{31}$ (collectively shift register 120), an OR logic gate 130, an exclusive-Or (XOR) logic gate 140, a clock signal 150 and a trigger signal 160. Although in FIG. 1, the first logic gate is illustratively depicted as comprising an XNOR logic gate 110, in alternate embodiments of the present invention, the operation of the XNOR logic gate 110 may be replaced with an AND gate in accordance with the concepts of the present invention. More specifically, because the clock signal 150 in the present invention is a logical high (logic 1), the Boolean logic of the present invention is limited to the case of when at least one of the inputs is a logical high, which results in the same answer for an XNOR logic gate or an AND logic gate.

In the representative logic circuit 100 of FIG. 1, the clock signal 150 functions as a first of two inputs to the XNOR logic gate 110. A bit from the fast optical clock 150 is switched into the shift-registers 120 when the output of the OR logic gate 130 is a logical high (e.g., a logic one), the clock signal determining the data-rate of the output of the logic circuit 100. The second input to the XNOR logic gate 110 is provided by an output of the OR logic gate 130. The output of the XNOR logic gate 110 is communicated to the first shift register 120. For the logic circuit 100 representative of a PRBS generator of the present invention having 31 shift registers, an EXOR logic operation of the $3^{rd}$ bit (or the $28^{th}$ bit) and the $31^{st}$ bit of the shift registers 120 is performed by the XOR logic gate 140. More specifically, the $3^{rd}$ bit (or the $28^{th}$ bit) and the $31^{st}$ bit of the shift registers 120 are the taps of the PRBS generator of FIG. 1. The outcome of the XOR logic gate 140 is then communicated as a first of two inputs (feedback signal) to the OR logic gate 130. The second input to the OR logic gate 130 is provided by the trigger signal 160. In a PRBS generator of the present invention, a trigger bit is needed to initiate the proper working of the circuit. As previously mentioned above, the output of the OR logic gate 130 acts as a second input to the XNOR logic gate 110. Although the logic circuit 100 of FIG. 1 is depicted as being initiated by a trigger signal 160, in accordance with the concepts of the present invention, other known methods or techniques may be implemented to initiate a logic circuit in accordance with the present invention. For example, a logic circuit in accordance with the present invention may be initiated using, for example, the clock signal 150.

Although in the logic circuit 100 of FIG. 1, the Boolean logic function is described with respect to a PRBS generator having 31 shift registers (N=31), a single EXOR operation and two taps, in alternate embodiments of the present invention a logic circuit for PRBS generation in accordance with the present invention may be modified to operate for PRBS generation implementing various values of N, multiple EXOR operations and more than two taps, as long as the correct bits (taps), specific to the value of N, are used for included EXOR logic operations as described above.

More specifically, an N-bit LFSR may be in one of $2^N-1$ internal states. This means that it is capable of generating a $2^N-1$-bit-long pseudo-random sequence before repeating. (A $2^N-1$ bit-long sequence is generated and not a $2^N$ bit-long sequence because a shift register filled with zeros will cause the LFSR to output a never-ending stream of zeros and this is not particularly useful.) Only LFSRs with certain tap sequences will cycle through all $2^N-1$ internal states; these are the maximal-length LFSRs. For a given N-bit shift register, the taps chosen determine the PRBS pattern. If the proper taps are not chosen, the pattern will repeat too early. A properly chosen tap sequence yields a maximal length PRBS sequence.

Figure 2:
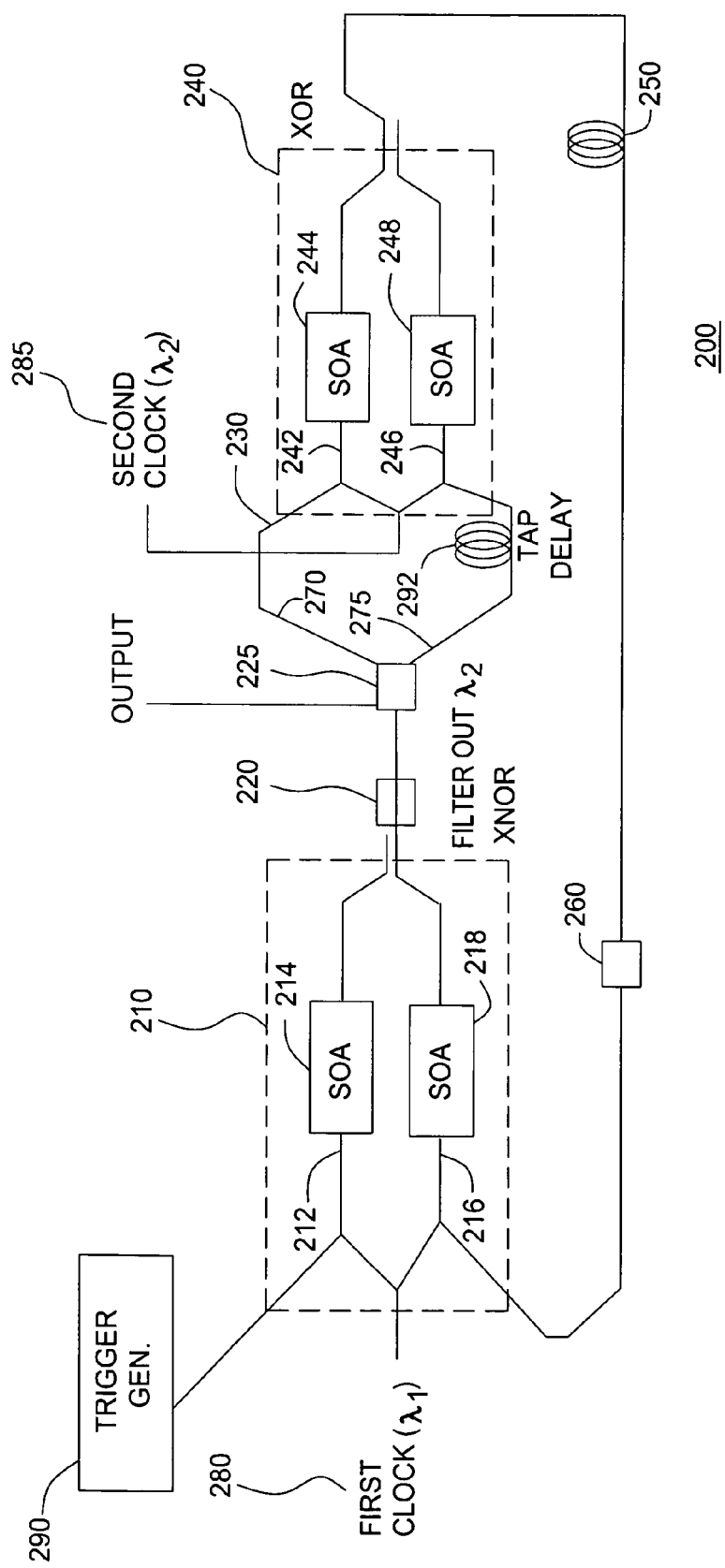
FIG. 2 depicts a high level block diagram of an embodiment of an all-optical linear feedback circuit of the present invention operating as a maximal-length PRBS generator in accordance with the present invention.

FIG. 2 depicts a high level block diagram of an embodiment of an all-optical linear feedback circuit of the present invention operating as a maximal length PRBS generator in accordance with the present invention. The all-optical maximal length PRBS generator 200 of FIG. 2 comprises a first optical logic gate (illustratively an XNOR gate) 210, a first optical filter 220, an optical splitter 225, an optical delay circuit 230 comprising two separate optical paths 270 and 275, one of the optical paths including a first delay element 292, a second optical logic gate (illustratively an XOR gate) 240, a second delay element 250 and a second optical filter 260. The optical XNOR gate 210 of FIG. 2 comprises a first Mach-Zehnder Interferometer having a first semiconductor optical amplifier (SOA) 214 in a first arm 212 and a second SOA 218 in a second arm 216. Similarly, the optical XOR gate 240 of FIG. 2 comprises a second Mach-Zehnder Interferometer having a first SOA 244 in a first arm 242 and a second SOA 248 in a second arm 246. FIG. 2 further illustrates a first optical clock (illustratively an RZ laser) 280 having a first wavelength, a second optical clock 285 having a second wavelength and a trigger generator 290. In accordance with the present invention, the delay elements of the present invention may be substantially any components or devices that provide a delay to an optical signal, such as an optical phase shifter. Even further, the delay elements of the present invention may be variable delay elements implemented to change the optical path length of the PRBS generator 200 of FIG. 2 to, for example, adapt the PRBS generator for operation using various values of N (i.e., the total number of registers in conventional PRBS generator circuits). Furthermore, although the PRBS generator 200 of FIG. 2 is illustratively depicted as comprising SOAs, any nonlinear element, such as quantum dots, capable of imparting an intensity-dependent phase modulation on a combined signal propagating therein may be implemented in place of the SOAs in alternate embodiments of the present invention.

In addition, although in the PRBS generator 200 of FIG. 2 the first optical logic gate is depicted as an XNOR logic gate 210, in alternate embodiments of the present invention, an optical AND gate and an optical OR gate may be used in place of the XNOR gate. More specifically, because in a PRBS generator of the present invention a condition never exists wherein the trigger signal and the feedback inputs to an XNOR logic gate are both a logical high (logic 1) or both a logical low (logic 0) except at initiation, the Boolean logic table for the XNOR gate of the present invention is identical to that of an AND gate. As such the XNOR gate of the present invention may be replaced by an AND gate, wherein the feedback signal and the trigger signal are the inputs to the OR gate and the output of the OR gate and the clock signal are the inputs to the AND gate.

In the all-optical PRBS generator 200 of FIG. 2, light from the first optical clock 280 at a first wavelength, illustratively $\lambda_1$, carries an optical clock (a constant stream of '1' bits) at a high data-rate, e.g. 80-Gbit/s, that is intensity modulated in a return-to-zero (RZ) format. The clock signal from the first optical clock 280 is communicated as a first of three inputs to the XNOR gate 210. The other inputs to the XNOR gate 210 include an output from the XOR gate 240 (feedback signal) and a trigger bit from the trigger generator 290. A single trigger bit is essential to start the PRBS generation, as it acts to switch one of the input clock bits to the output of the XNOR gate 210 (i.e., seed the shift registers). The clock signal from the first optical clock 280 is communicated to both the first SOA 214 in the first arm 212 of the Mach-Zehnder Interferometer and the second SOA 218 in the second arm 216 of the Mach-Zehnder Interferometer of the XNOR gate 210. The trigger bit from the trigger generator 290, however, is only directed to the first SOA 214 in the first arm 212 of the Mach-Zehnder Interferometer of the XNOR gate 210. The trigger bit is configured to have a second wavelength, illustratively $\lambda_2$. The output from the XOR gate 240, acting as a third input to the XNOR gate 210, is only directed to the second SOA 218 in the second arm 216 of the Mach-Zehnder Interferometer of the XNOR gate 210.

To explain the operation of the optical XNOR gate 210 and the optical XOR gate 240 of the present invention, the function of the SOAs 214, 218, 244 and 248 (or any other nonlinear element capable of imparting an intensity-dependent phase modulation) must first be described. The material gain spectrum of an SOA is homogenously broadened. This means that carrier density changes in the amplifier will affect all of the input signals, so it is possible for a strong signal at one wavelength to affect the gain of a weak signal at another wavelength. This non-linear mechanism is called cross gain modulation (XGM). In one XGM scenario, a weak pulsed probe signal and a strong pulsed pump signal, with a small wavelength offset, are injected into an SOA. XGM in the amplifier will impose the pump modulation on the probe. This means that the amplifier is acting as a wavelength converter. The refractive index of an SOA active region is not constant but is dependent on the carrier density and the material gain. This implies that the phase and gain of an optical wave propagating through the amplifier are coupled via gain saturation.

If more than one signal is injected into an SOA, there will be cross-phase modulation (XPM) between the signals. In XPM, the local index change caused by the intensity of one pulse induces a phase modulation in a second co-propagating pulse. However, because XPM only causes phase changes, the SOA must be placed in an interferometric configuration (such as a Mach Zehnder) to convert phase changes in the signals to intensity changes using constructive or destructive interference at the output junction of the interferometer. The patterns of interference may be chosen to produce almost any desired output function, given two input pulses.

Keeping in mind the properties of an SOA (or any other nonlinear element capable of imparting an intensity-dependent phase modulation) described above and referring back to FIG. 2, the operation of an optical XNOR gate and an optical XOR gate in accordance with the present invention will be described. Optical signals (a series of logical ones) from the first optical clock 280 are communicated as inputs to both arms 212, 216 of the optical XNOR gate 210 and as such, to the first and second SOAs 214, 218 of the XNOR gate 210. A signal from the trigger generator 290 is communicated to the first arm 212 of the optical XNOR gate 210 and as such, to the first SOA 214 of the XNOR gate 210. A feedback signal from the XOR gate 240 is communicated to the second arm 216 of the optical XNOR gate 210 and as such, to the second SOA 218 of the XNOR gate 210. If a signal from the trigger generator 290 comprises a logical high (happens only once to initiate PRBS generator 200), the clock signal in the first SOA 214 experiences a phase shift relative to a combination of the signal intensities of the clock and the trigger signals and the biasing current of the first SOA 214. In this embodiment of an all-optical maximal length PRBS generator 200, the second SOA 218 has substantially the same bias as the first SOA 214. As such, if an optical signal from optical XOR gate 240 (the feedback signal) comprises a logical high, the clock signal in the second SOA 218 experiences a phase shift equal to the phase shift experienced in the first SOA 214. This is never the case, however, because the signal from the trigger generator 290 is only a logical high during initiation of the PRBS generator 200, at which time the feedback signal from the XOR gate 240 is a logical low. Similarly, if a signal from the trigger generator 290 comprises a logical low and the feedback signal from the XOR gate 240 comprises a logical low, the clock signal in the first SOA 214 experiences a phase shift equal to the phase shift experienced in the second SOA 218. What is important to note is that in the PRBS generator 200 of FIG. 2, because the SOAs 214, 218 have substantially the same bias, if the signal from the trigger generator 290 and the feedback signal from the XOR gate 240 are the same, the clock signal in the first SOA 214 experiences a phase shift equal to the phase shift experienced in the second SOA 218. If however, a signal from the trigger generator 290 and a feedback signal from the XOR gate 240 are different (i.e., one comprises a logical high and the other comprises a logical low), the clock signal in one of the SOAs experiences a different phase shift (i.e., a 180 degree phase shift difference) than the phase shift experienced in the other SOA.

In the XNOR gate 210, the shifted optical signals are coupled and output from the XNOR gate 210 by placing the output waveguides of the first arm 212 of the XNOR gate 210 and the second arm 216 of the XNOR gate 210 in close proximity such that the optical signals in the output waveguide of the first arm 212 and the output waveguide of the second arm 216 optically interfere (i.e., essentially forming an output coupler). As depicted in FIG. 2, in the PRBS generator 200, the output waveguide of the second arm 216 is utilized as the output for the XNOR gate 210. More specifically, the output waveguide of the first arm 212 and the output waveguide of the second arm 216 are configured and constructed such that when an optical signal from the trigger generator 290 and a feedback signal from the XOR gate 240, acting as inputs to the XNOR gate 210, comprise the same logic (i.e., both are a logical low), the clock signal in the first arm 212 of the XNOR gate 210 and the clock signal in the second arm 216 of the XNOR gate 216, having been phase shifted by the same amount, constructively interfere in the output waveguide of the first arm 212 and destructively interfere in the output waveguide of the second arm 216. As such, the output of the XNOR gate 210 from the output waveguide of the second arm 216 comprises a logical low.

Referring back to FIG. 1, the Boolean logic for a PRBS generator in accordance with the present invention was depicted as performing a logic OR operation on a trigger signal and a feedback signal from an XOR gate and performing an XNOR operation on the result of the OR operation and a clock signal. However, in the PRBS generator 200 of FIG. 2, the OR operation is implicit. More specifically, because a trigger signal and a feedback signal from the XOR gate are never both a logical high and because the output of the XNOR gate 210 is configured such that if a trigger signal and a feedback signal are the same, the output of the XNOR gate 210 is a logical low, and if a trigger signal and a feedback signal are different, the output of the XNOR gate 210 is a logical high, the OR logic table is satisfied. That is, in the PRBS generator 200 of FIG. 2, the only time a trigger signal and a feedback signal are the same is when they both comprise a logical low. In an OR logic truth table, when both inputs are low, the output is low. Similarly, in the PRBS generator 200 of FIG. 2 the only time a trigger signal and a feedback signal are different is when one comprises a logical low and the other comprises a logical high. In an OR logic truth table, when at least one of the inputs comprises a logical high, the output is high. As such, the OR function of the present invention is satisfied.

Furthermore and referring back to FIG. 1, the Boolean logic for a PRBS generator in accordance with the present invention was depicted as performing an XNOR operation on the result of the OR operation and a clock signal. In the PRBS generator 200 of FIG. 2, the clock signal from the first clock 280 is always a logical high. As such, the XNOR logic table is limited to the cases when one of two inputs (i.e., the clock signal) is always a logical high (e.g., a logic one). Having an output configuration as described above and because the signal from the clock 280 is always a logical high (logic 1), the optical XNOR gate 210 of the all-optical PRBS generator 200 of FIG. 2 complies with the conventional Boolean logic of an XNOR gate as depicted in Table (1) below.

TABLE 1

XNOR Boolean Logic

| Input A | Input B | Output |
|---------|---------|--------|
| 0 | 1 | 0 |
| 1 | 1 | 1 |

In Table 1 above, Input A depicts an OR operation of a trigger signal and a feedback signal from the XOR gate 240 and Input B depicts the always logical high clock signal from the first clock 280. In accordance with the XNOR Logic depicted in Table 1, in the XNOR gate 210 of the all-optical PRBS generator 200 of FIG. 2, if a signal from the trigger bit generator 290 and a feedback signal from the optical XOR gate 240 are the same (i.e., can only be both logical lows) and the clock signal is a logical high, which is always the case, a logical low is output on the output waveguide of the second arm 216 of the XNOR gate 210 (destructive interference). In contrast, if a signal from the trigger bit generator 290 and a signal from the optical XOR gate 240 are not the same, which results in an OR logic logical high and the clock signal is a logical high, which is always the case, a logical high is output on the output waveguide of the second arm 216 of the XNOR gate 210 (constructive interference).

Although in the all-optical maximal length PRBS generator 200 of FIG. 2, the output of the XNOR gate 210 was depicted as coming from the output waveguide of the second arm 216 of the XNOR gate 210, in alternate embodiments of the present invention, the output of the XNOR gate 210 may be taken from the output waveguide of either the first arm 212 or the second arm 216.

More specifically, in the all-optical PRBS generator 200 of FIG. 2 the waveguides comprising the first arm 212 and the second arm 216 of the Mach-Zehnder Interferometer of the XNOR gate 210 are placed in close proximity such that the optical signals in the first waveguide and the second waveguide optically interfere in the output waveguides of the first arm 212 and the second arm 216. As such, the output waveguides of the first arm 212 and the second arm 216 essentially form a coupler. By manipulating the length and the distance between the output waveguides of the first arm 212 and the second arm 216, a desired output may be manipulated to be output from either arm. For example, in the all-optical PRBS generator 200 of FIG. 2, the output waveguides of the first arm 212 and the second arm 216 of the XNOR gate 210 may instead be configured and constructed such that when a signal from the trigger bit generator 290 and a feedback signal from the optical XOR gate 240 are the same (i.e., can only be both logical lows) and the clock signal is a logical high, which is always the case, a logical low is output on the output waveguide of the first arm 212 of the XNOR gate 210 (destructive interference) instead of on the output waveguide of the second arm 216. In such an embodiment, if a signal from the trigger bit generator 290 and a feedback signal from the optical XOR gate 240 are not the same and the clock signal is a logical high, which is always the case, a logical high is output on the output waveguide of the first arm 212 of the XNOR gate 210 (constructive interference) instead of on the output waveguide of the second arm 216.

Referring back to FIG. 2, the output of the XNOR gate 210 is communicated to the first optical filter 220, which filters any remaining trigger signal (and any remaining signal from the second clock, described below), illustratively wavelength $\lambda_2$, from the output of the XNOR gate 210. The output of the first optical filter 220 is then split by the optical splitter 225. A portion of the output of the first optical filter 220 split by the optical splitter 225 functions as an output for the all-optical PRBS generator 200 of FIG. 2. The remaining signal is split and directed along the two separate optical paths 270, 275 of the delay circuit 230. Although in FIG. 2, the output of the filter 220 is illustrated as being split by an optical splitter 225, in alternate embodiments of the present invention, optical couplers and other optical splitting devices, such as Y-branch couplers or multi-mode interferometers, may be implemented in place of the optical splitter 225 of FIG. 2 for splitting the output of the first optical splitter 220.

In the delay circuit 230, a specific bit delay (depending upon N) is added to one of the optical paths 270, 275. For example, in FIG. 2 where N=31, a 28-bit delay (or a 3-bit delay) is added to the second optical path 275 by the first delay element 292. It should be noted that for other tap sequences and numbers of EXOR gates in alternate embodiments of PRBS generators and linear feedback circuits of the present invention, an appropriate delay may also be added on the first arm 270 of the delay circuit. The output of each of the optical paths 270, 275 of the delay circuit function as a first and second input of three inputs to the XOR gate 240. The third input to the XOR gate 240 is a second clock input from the second optical clock 285. The second optical clock is illustratively an RZ laser having a second wavelength, illustratively $\lambda_2$. Note that in the embodiment of FIG. 2, the second optical clock 285 comprises the same wavelength, $\lambda_2$, as the trigger signal and as such, both signals, the trigger signal and the clock signal, may be filtered using the first optical filter 220. In alternate embodiments of the present invention where a trigger signal and a second clock signal comprises different wavelengths, a first optical filter may be configured to filter both optical signals or alternatively, an additional optical filter may be implemented to filter the signal from the second clock so that any remaining feedback signal does not interfere with inputs to the delay circuit.

Referring back to FIG. 2, the second optical clock 285 may be modulated at the same data-rate as the first optical clock 280 and may be modulated on substantially any wavelength not equal to the wavelength of the first optical clock 280, or alternatively, may be a continuous signal. Although the all-optical maximal length PRBS generator 200 of FIG. 2 comprises a second optical clock 285, in alternate embodiments of all-optical maximal length PRBS generators of the present invention only a single first optical clock may be necessary if the nonlinear elements used for imparting an intensity-dependent phase modulation are capable of substantially complete constructive or destructive interference. More specifically, the second clock of the all-optical maximal length PRBS generators of the present invention is implemented to provide regeneration of the optical signal in the PRBS generator to provide acceptable extinction ratios for the PRBS generator and to provide re-timing of the signals output from the XNOR gate 210 if the signals have been degraded within the XNOR gate 210. Such a second optical clock may not be needed if the nonlinear elements implemented in the optical logic gates of the present invention provide minimal loss on signals propagating therein.

Referring back to FIG. 2, the clock signal from the second optical clock 285 is communicated to both the first SOA 244 in the first arm 242 of the Mach-Zehnder Interferometer and the second SOA 248 in the second arm 246 of the Mach-Zehnder Interferometer of the XOR gate 240. The output of the first optical path 270 of the delay circuit 230, however, is only directed to the first SOA 244 in the first arm 242 of the Mach-Zehnder Interferometer of the XOR gate 240. The output of the second optical path 275 of the delay circuit 230 is directed to the second SOA 248 in the second arm 246 of the Mach-Zehnder Interferometer of the XOR gate 240.

The EXOR operation of the XOR gate 240 is performed using the two SOAs 244 and 248 in the Mach-Zehnder Interferometer of the XOR gate 240 in substantially the same manner as described above for the XNOR gate 210 except that in the XOR gate 240, the output of the XOR gate 240 is taken from the output waveguide of the first arm 242 of the Mach-Zehnder Interferometer of the XOR gate 240. That is, the waveguides comprising the first arm 242 and the second arm 246 of the Mach-Zehnder Interferometer of the XOR gate 240 are, as described above for the XNOR gate 210, placed in close proximity such that the optical signals in the first waveguide and the second waveguide optically interfere in the output waveguide of the first arm 242 and the second arm 246. However, the signal in the second arm 246 of the Mach-Zehnder Interferometer of the XOR gate 240 is, in this embodiment, discarded, but may be used in alternate embodiments of the present invention for monitoring or troubleshooting an all-optical linear feedback circuit of the present invention.

Although in the all-optical maximal length PRBS generator 200 of FIG. 2, the output of the XOR gate 240 was depicted as coming from the output waveguide of the first arm 242 of the XOR gate 240, in alternate embodiments of the present invention, the output of the XOR gate 240 may be taken from the output waveguide of either the first arm 242 or the second arm 246.

More specifically, in the all-optical PRBS generator 200 of FIG. 2, the waveguides comprising the first arm 242 and the second arm 246 of the Mach-Zehnder Interferometer of the XOR gate 240 are placed in close proximity such that the optical signals optically interfere in the output waveguides of the first arm 242 and the second arm 246. As such, the output waveguides of the first arm 242 and the second arm 246 essentially form a coupler. By manipulating the length and the distance between the output waveguides of the first arm 242 and the second arm 246 of the XOR gate 240, a desired output may be manipulated to be output from either arm. For example, in the all-optical PRBS generator 200 of FIG. 2, the output waveguides of the first arm 242 and the second arm 246 of the XOR gate 240 may instead be configured and constructed such that the output of the XOR gate 240 is taken from the output waveguide of the second arm 246 of the XOR gate 240.

It should be noted however, that if the output waveguides of the first arm 212 and the second arm 216 of the XNOR gate 210 (the XNOR output coupler) and the output waveguides of the first arm 242 and the second arm 246 of the XOR gate 240 (the XOR output coupler) are substantially the same, the complementary outputs of the gates be used. For example, if the output couplers of the XNOR gate 210 and the XOR gate 240 are substantially the same, if the output of the XNOR gate 210 is taken from the output waveguide of the second arm 216 of the XNOR gate 210, then the output of the XOR gate 240 must be taken from the first arm 242 of the XOR gate 240, and vice-versa.

Referring back to FIG. 2, the signal taken from the output waveguide of the first arm 242 of the Mach-Zehnder Interferometer of the XOR gate 240 of the all-optical PRBS generator 200 of FIG. 2 complies with the conventional Boolean logic of an XOR gate as depicted in Table (2) below.

TABLE 2

XOR Boolean Logic

| Input A | Input B | Output |
|---------|---------|--------|
| 0 | 0 | 0 |
| 0 | 1 | 1 |
| 1 | 0 | 1 |
| 1 | 1 | 0 |

In Table 2 above, Input A depicts a signal from the first arm 270 of the delay circuit 230 and Input B depicts a signal from the second arm 275 of the delay circuit 230 or vice-versa.

Referring back to FIG. 2, the output of the XOR gate 240 is communicated as a feedback signal to one of the inputs of the XNOR gate 210 as described above. The second delay element 250 of the PRBS generator 200 of FIG. 2 is used to precisely control the length of the feedback path, such that the output of the XOR gate 240 reach the input of the XNOR gate 210 after a time interval of exactly N bits (i.e., 31 bits for the example of FIG. 2).

Light at the first optical clock wavelength, $\lambda_2$, from the output of the XOR gate 240 is filtered out using the second optical filter 260 so that the first optical clock signal does not interfere with the operation of the XNOR gate 210 via the feedback path. As earlier described, light at the wavelength of the trigger signal and light at the wavelength of the second clock, $\lambda_2$, may be filtered out using the first optical filter 220 so that any remaining trigger and any remaining signal from the second clock 285 do not interfere with the operation of the XOR gate 240.

Figure 3:
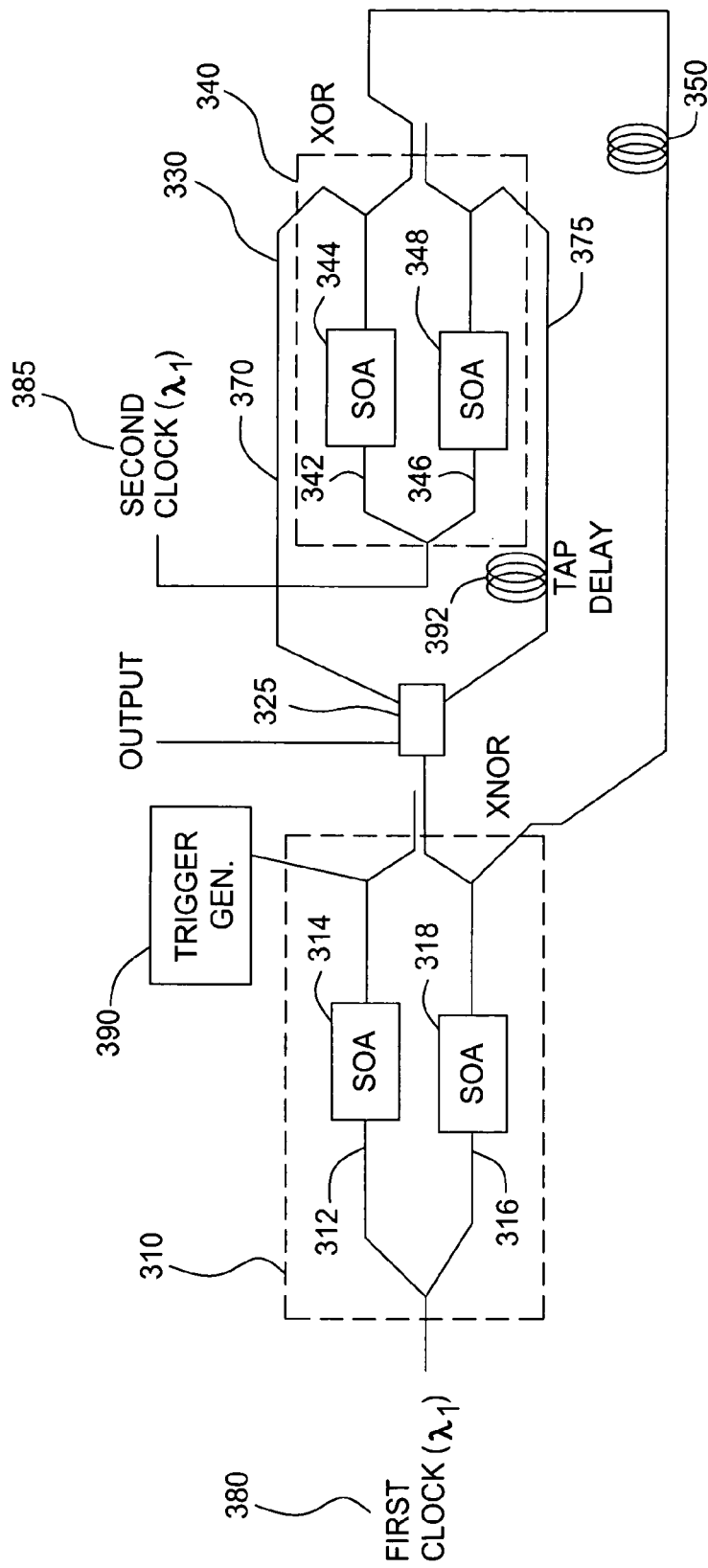
FIG. 3 depicts a high level block diagram of an alternate embodiment of an all-optical linear feedback circuit of the present invention operating as a maximal-length PRBS generator in accordance with the present invention.

In an alternate embodiment of an all-optical linear feedback circuit in accordance with the present invention, optical filters, such as the first optical filter 220 and the second optical filter 260 of the maximal length PRBS generator of FIG. 2, are not needed in the circuit because of the design of the circuit, and more specifically, the direction of propagation of the trigger signal and the clock signals. For example, FIG. 3 depicts a high level block diagram of an alternate embodiment of an all-optical linear feedback circuit of the present invention functioning as a maximal-length PRBS generator in accordance with the present invention. The maximal-length PRBS generator 300 of FIG. 3 comprises substantially the same components as the maximal-length PRBS generator 200 of FIG. 2 with the exception that the maximal-length PRBS generator 300 of FIG. 3 does not necessarily include optical filters.

The all-optical maximal length PRBS generator 300 of FIG. 3 comprises an optical XNOR gate 310, an optical splitter 325, an optical delay circuit 330 comprising two separate optical paths 370 and 375, one of the optical paths including a first delay element 392, an optical XOR gate 340 and a second delay element 350. The optical XNOR gate 310 of FIG. 3 comprises a first Mach-Zehnder Interferometer having a first semiconductor optical amplifier (SOA) 314 in a first arm 312 and a second SOA 318 in a second arm 316. Similarly, the optical XOR gate 340 of FIG. 3 comprises a second Mach-Zehnder Interferometer having a first SOA 344 in a first arm 342 and a second SOA 348 in a second arm 346. FIG. 3 further illustrates a first optical clock (illustratively an RZ laser) 380, a second optical clock 385 and a trigger generator 390. In accordance with the present invention, the delay elements of the present invention may be substantially any components or devices that provide a delay to an optical signal, such as an optical phase shifter. Even further, the delay elements of the present invention may be variable delay elements implemented to change the optical path length of the PRBS generator 300 of FIG. 3 to, for example, adapt the PRBS generator for operation using various values of N (i.e., the total number of registers in conventional PRBS generator circuits). Furthermore, although the PRBS generator 300 of FIG. 3 is illustratively depicted as comprising SOAs, any nonlinear element, such as quantum dots, capable of imparting an intensity-dependent phase modulation on a combined signal propagating therein may replace the SOAs of the present invention.

The operation and function of the PRBS generator 300 of FIG. 3 is substantially the same as the PRBS generator 200 of FIG. 2, however because the trigger signal from the Trigger Generator 390 of the PRBS generator 300 is counter-propagated, the trigger signal and the signal from the first clock 380 will not interfere. Similarly, because a signal from the first clock 380 is counter-propagated with respect to a signal from the second clock 385, the clock signals do not interfere, and as such, the two clock signals may actually be taken from the same clock source. Because the optical signals propagating in the PRBS generator 300 of FIG. 3 do not interfere, the optical filters present and illustrated in the PRBS generator 200 of FIG. 2 are not needed in this embodiment.

An all-optical PRBS generator in accordance with the present invention, such as the PRBS generator 200 of FIG. 2 or the PRBS generator 300 of FIG. 3, is capable of generating maximal length PRBS sequences at high data rates (e.g., 80-Gbits/s) on an optical channel. More specifically, the speed of an all-optical linear feedback circuit and as such an all-optical maximal length PRBS generator in accordance with the present invention is greatly dependent upon the choice of materials used to create it and the structure of the circuit. For example, the SOAs and the waveguides of an all-optical linear feedback circuit in accordance with the present invention may be comprised of silica, indium phosphide, or various polymers to name a few. Such materials respond very quickly to incident pulses and components comprised from such materials may be integrated according to known integrations techniques.

The SOAs implemented within embodiments of the present invention respond very quickly to incident pulses, and may therefore respond to any sequence of pulses spaced closely together. Furthermore, waveguide technology allows all-optical linear feedback circuits of the present invention to be realized as very small devices in which the pulses do not have to travel far (and therefore risk distortion and attenuation).

Furthermore, more complex Boolean circuits for PRBS generation, or for the optical generation of keys for encryption based on linear feedback shift registers, may be easily constructed in accordance with the present invention. For example, with the choice of suitable delays, such as the second delay element 292 and the first delay element 250 of the PRBS generator 200 of FIG. 2, multiple EXOR operations may be performed using at least two SOAs for each operation. In PRBS generators of such embodiments of the present invention, the output from each EXOR gate may also be used as inputs to other XOR gates. This may be accomplished using a cascade of SOAs.

Figure 4:
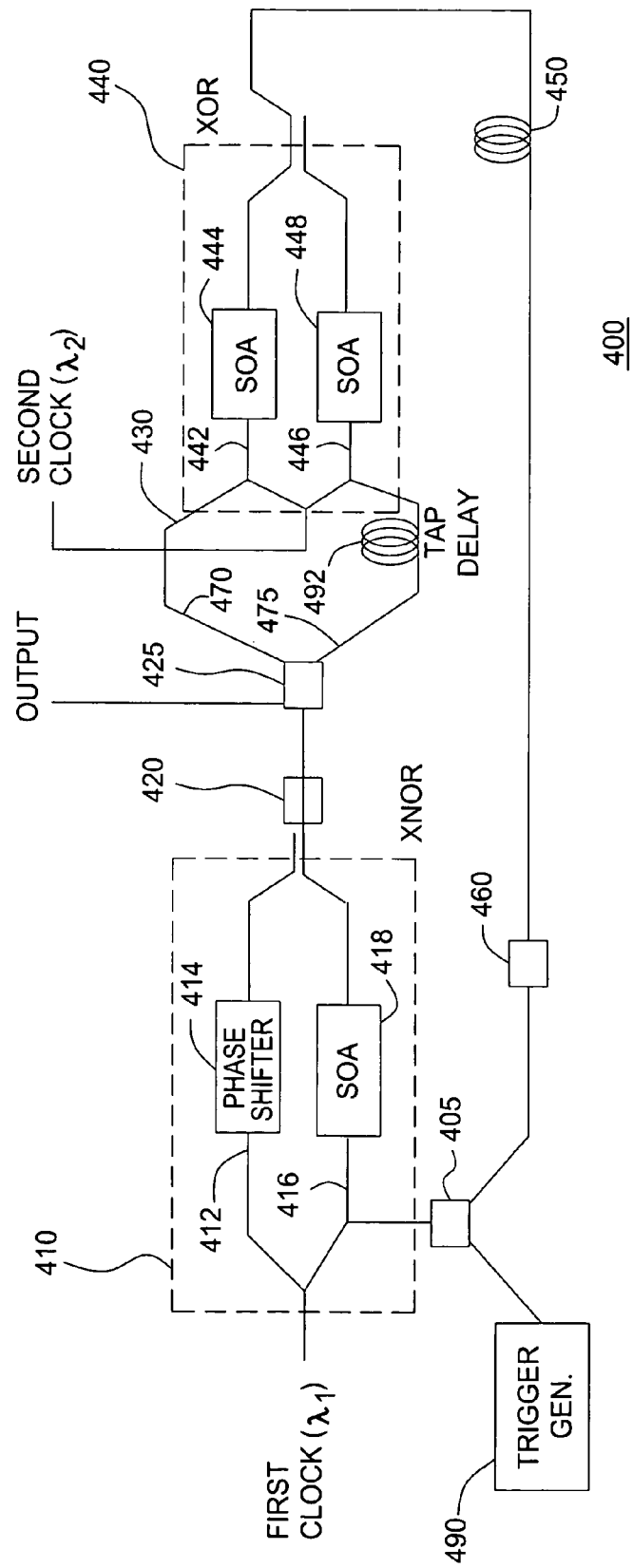
FIG. 4 depicts a high level block diagram of an alternate embodiment of an all-optical linear feedback circuit in accordance with the present invention.

In an alternate embodiment of an all-optical feedback circuit in accordance with the present invention, only a single nonlinear element capable of imparting an intensity-dependent phase modulation is needed in the first optical logic circuit because of the design of the circuit, and more specifically, because of where the trigger signal is input into the PRBS generator. For example, FIG. 4 depicts a high level block diagram of an alternate embodiment of an all-optical linear feedback circuit of the present invention functioning as a maximal-length PRBS generator in accordance with the present invention. The maximal-length PRBS generator 400 of FIG. 4 comprises substantially the same components as the maximal-length PRBS generator 200 of FIG. 2 with the exception that the maximal-length PRBS generator 400 of FIG. 4 does not necessarily require a nonlinear element capable of imparting an intensity-dependent phase modulation in both arms of the first optical logic gate.

For example, the maximal-length PRBS generator 400 of FIG. 4 illustratively comprises an input coupler 405, an optical XNOR gate 410, a first optical filter 420, an optical splitter 425, an optical delay circuit 430 comprising two separate optical paths 470 and 475, one of the optical paths including a first delay element 492, an optical XOR gate 440, a second delay element 450 and a second optical filter 460. The optical XNOR gate 410 of FIG. 4 comprises a first Mach-Zehnder Interferometer having a phase shifter 414 in a first arm 412 and a first SOA 418 in a second arm 416. The optical XOR gate 440 of FIG. 4 comprises a second Mach-Zehnder Interferometer having a first SOA 444 in a first arm 442 and a second SOA 448 in a second arm 446. FIG. 4 further illustrates a first optical clock (illustratively an RZ laser) 480 having a first wavelength, a second optical clock 485 having a second wavelength and a trigger generator 490. In accordance with the present invention, the delay elements of the present invention may be substantially any components or devices that provide a delay to an optical signal, such as an optical phase shifter. Even further, the delay elements of the present invention may be variable delay elements implemented to change the optical path length of the PRBS generator 400 of FIG. 4 to, for example, adapt the PRBS generator for operation using various values of N (i.e., the total number of registers in conventional PRBS generator circuits). Furthermore, although the PRBS generator 400 of FIG. 4 is illustratively depicted as comprising SOAs, any nonlinear element, such as quantum dots, capable of imparting an intensity-dependent phase modulation on a combined signal propagating therein may be implemented in place of the SOAs in alternate embodiments of the present invention.

The operation and function of the PRBS generator 400 of FIG. 4 is substantially the same as the PRBS generator 200 of FIG. 2, however the trigger signal from the Trigger Generator 490 of the PRBS generator 400 and the feedback signal from the XOR gate 440 are coupled by the input coupler 405, which operates as an OR gate between the trigger and feedback signals. As such, only the second arm 416 of the XNOR gate 410 requires a nonlinear element capable of imparting an intensity-dependent phase modulation as described above. As depicted in FIG. 4, the first arm 412 of the XNOR gate 410 merely requires an element or component capable of providing a delay or phase shift. As such, the delay element 405 of the PRBS generator 400 of FIG. 4, although illustratively depicted as a phase shifter, may comprise substantially any component, such as a waveguide having an appropriate length, capable of providing the necessary delay.

Figure 5:
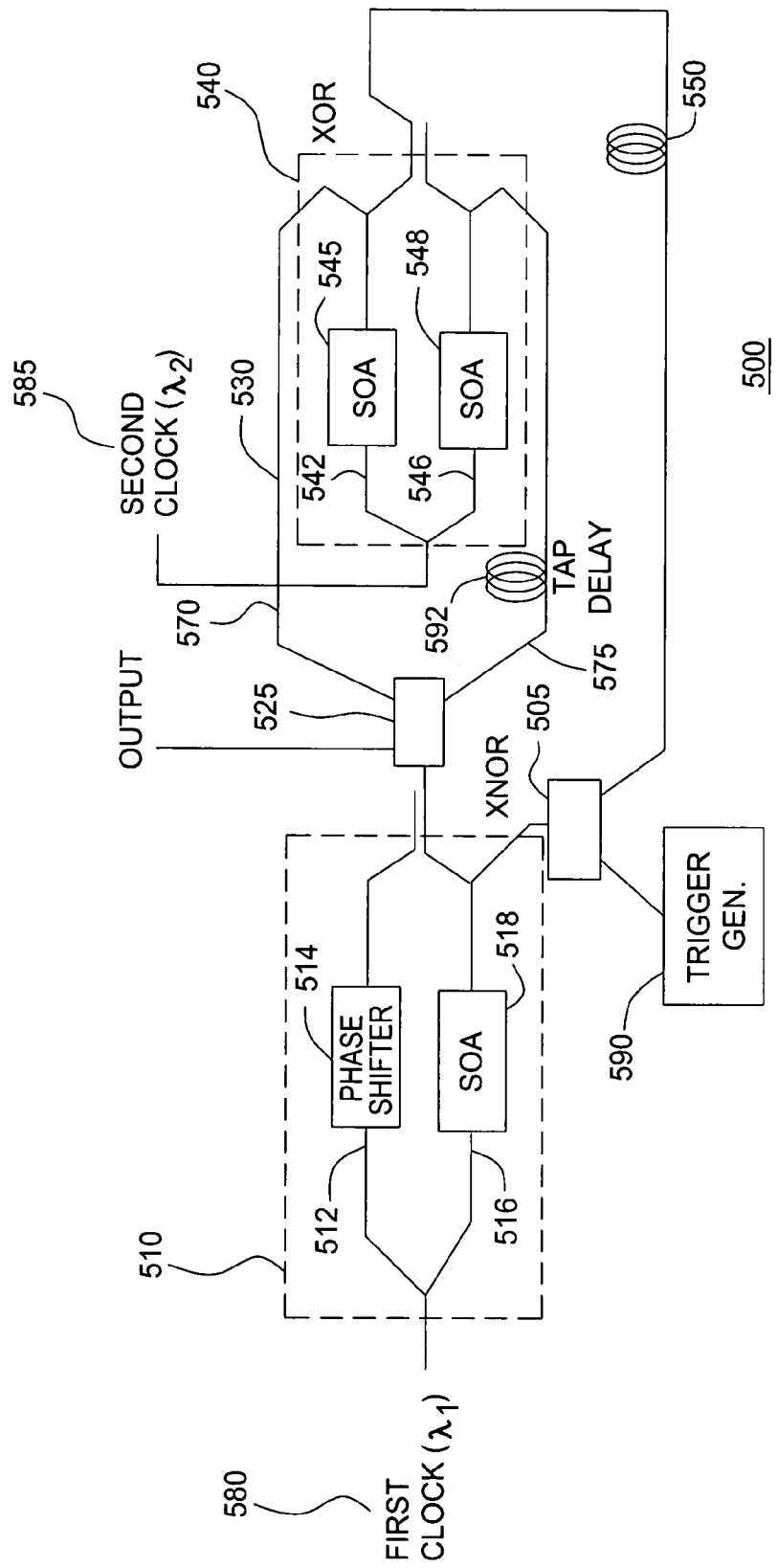
FIG. 5 depicts a high level block diagram of an alternate embodiment of the maximal-length PRBS generator of FIG. 4 in accordance with the present invention.

In an alternate embodiment of the maximal-length PRBS generator 400 of FIG. 4, optical filters, such as the first optical filter 420 and the second optical filter 460, are not needed in the circuit because of the design of the circuit, and more specifically, because of the direction of propagation of the trigger signal. For example, FIG. 5 depicts a high level block diagram of an alternate embodiment of the maximal-length PRBS generator 400 of FIG. 4 in accordance with the present invention. The maximal-length PRBS generator 500 of FIG. 5 comprises substantially the same components as the maximal-length PRBS generator 400 of FIG. 4 with the exception that the maximal-length PRBS generator 500 of FIG. 5 does not necessarily include optical filters.

The maximal-length PRBS generator 500 of FIG. 5 illustratively comprises an input coupler 505, an optical XNOR gate 510, an optical splitter 525, an optical delay circuit 530 comprising two separate optical paths 570 and 575, one of the optical paths including a first delay element 592, an optical XOR gate 540, and a second delay element 550. The optical XNOR gate 510 of FIG. 5 comprises a first Mach-Zehnder Interferometer having a phase shifter 514 in a first arm 512 and a first SOA 518 in a second arm 516. The optical XOR gate 540 of FIG. 5 comprises a second Mach-Zehnder Interferometer having a first SOA 544 in a first arm 542 and a second SOA 548 in a second arm 546. FIG. 5 further illustrates a first optical clock (illustratively an RZ laser) 580 having a first wavelength, a second optical clock 585 having a second wavelength and a trigger generator 590. In accordance with the present invention, the delay elements of the present invention may be substantially any components or devices that provide a delay to an optical signal, such as an optical phase shifter. Even further, the delay elements of the present invention may be variable delay elements implemented to change the optical path length of the PRBS generator 500 of FIG. 5 to, for example, adapt the PRBS generator for operation using various values of N (i.e., the total number of registers in conventional PRBS generator circuits). Furthermore, although the PRBS generator 500 of FIG. 5 is illustratively depicted as comprising SOAs, any nonlinear element, such as quantum dots, capable of imparting an intensity-dependent phase modulation on a combined signal propagating therein may be implemented in place of the SOAs in alternate embodiments of the present invention.

The operation and function of the PRBS generator 500 of FIG. 5 is substantially the same as the PRBS generator 400 of FIG. 4, specifically the trigger signal from the Trigger Generator 590 of the PRBS generator 500 and the feedback signal from the XOR gate 540 are coupled by the input coupler 505, which operates as an OR gate between the trigger and feedback signals. As such, only the second arm 516 of the XNOR gate 510 requires a nonlinear element capable of imparting an intensity-dependent phase modulation as described above. As depicted in FIG. 5, the first arm 512 of the XNOR gate 510 merely requires an element or component capable of providing a delay or phase shift. As such, the delay element 505 of the PRBS generator 500 of FIG. 5, although illustratively depicted as a phase shifter, may comprise substantially any component, such as a waveguide having an appropriate length, capable of providing the necessary delay.

In addition and as depicted in FIG. 5, because the coupled trigger signal from the Trigger Generator 590 and the feedback signal from the XOR gate 540 of the PRBS generator 500 are counter-propagated, the coupled signals and the signal from the first clock 580 will not interfere. Similarly, because a signal from the first clock 580 is counter-propagated with respect to a signal from the second clock 585, the clock signals do not interfere, and as such, the two clock signals may actually be taken from the same clock source. Because the optical signals propagating in the PRBS generator 500 of FIG. 5 do not interfere, the optical filters present and illustrated in various other embodiments of the present invention, such as the PRBS generators of FIG. 2 and FIG. 4, are not required in this embodiment.

Although in the various embodiments of the present invention presented herein the optical logic gates were depicted as exclusive-NOR logic gates and exclusive-OR logic gates, it will be appreciated by those skilled in the art informed by the teachings of the present invention, that combinations of other logic gates, such as OR, AND, NOR, NAND, etc. logic gates, may be implemented within the concepts of the present invention to derive the desired exclusive-NOR and exclusive-OR logical operations described and included in the embodiments of the present invention.

While the forgoing is directed to various embodiments of the present invention, other and further embodiments of the invention may be devised without departing from the basic scope thereof. As such, the appropriate scope of the invention is to be determined according to the claims, which follow.

What is claimed is:

1. A method for generating a linear feedback bit sequence, comprising:
   optically performing an exclusive-NOR logical operation on a clocking signal, an initiation signal and a feedback signal;
   splitting a signal output of said exclusive-NOR logical operation into at least two optical paths, wherein the split signal in at least one of said at least two optical paths is delayed;
   optically performing an exclusive-OR logical operation on the split signals in said at least two optical paths; and
   feeding back a signal output of said exclusive-OR logical operation as the feedback signal for said exclusive-NOR logical operation.

2. A method for generating an all-optical linear feedback bit sequence, comprising:
   combining a first portion of a first clocking signal and an initiating signal in a first optical path;
   combining a second portion of said first clocking signal and a feedback signal in a second optical path;
   imparting an intensity-dependent phase modulation on at least one of the combined signals in said first and second optical paths;
   coupling the combined signals of said first and second optical paths such that the intensities of the combined signals interfere;
   splitting the coupled, combined signal of one of said first or second optical paths into at least a third and a fourth optical path;
   providing a delay to the split signal in at least one of said at least third and fourth optical paths;
   imparting an intensity-dependent phase modulation on each of the split signals in each of the third and the fourth optical paths;
   coupling the split signals of said third and fourth optical paths such that the intensities of the split signals interfere; and
   feeding back the coupled, split signal of one of said third or fourth optical paths to be combined with the second portion of said first clocking signal in said second optical path.

3. The method of claim 2, wherein the signal of said first or second optical paths that is split and the signal of said third and fourth optical paths that is fed-back are complementary outputs of said optical paths.

4. The method of claim 2, further comprising combining a first portion of a second clocking signal with the split signal in said third optical path and combining a second portion of said second clocking signal with the split signal in said third fourth optical path prior to the imparting of an intensity-dependent phase modulation.

5. The method of claim 4, wherein said second clocking signal improves the extinction ratio of the all-optical linear feedback bit sequence.

6. The method of claim 2, further comprising filtering said initiating signal prior to imparting an intensity-dependent phase modulation on each of the split signals in each of the third and the fourth optical paths.

7. The method of claim 2, further comprising filtering said feedback signal to remove any remaining component of said first clocking signal.

8. The method of claim 2, further comprising providing an optical delay to said feedback signal to control a total path length for generating said all-optical linear feedback bit sequence.

9. An all-optical linear feedback circuit, comprising:
   a first optical logic circuit for performing a logical operation on at least a clocking signal, an initiating signal and a feedback signal,
   a delay circuit, including at least two optical paths, wherein at least one of said at least two optical paths of said delay circuit includes an optical delay element and wherein an output of said first optical logic circuit is split and propagates along each of said at least two optical paths of said delay circuit;
   a second optical logic circuit for performing a logical operation on at least the outputs of said at least two optical paths of said delay circuit; and
   a feedback path for feeding back an output of said second optical logic circuit to said first optical logic circuit for providing said feedback signal.

10. An all-optical linear feedback circuit, comprising:
    a first optical logic circuit, including;
      a first input for receiving a first clocking signal for determining the data-rate of the all-optical linear feedback circuit;
      a second input for receiving a trigger signal;
      a third input for receiving a feedback signal;
      at least two optical paths, at least one of said at least two optical paths including at least one nonlinear element for imparting an intensity-dependent phase modulation on a combined signal propagating therein, wherein a first portion of said first clocking signal and said trigger signal are combined and propagate along a first one of said at least two optical paths, and a second portion of said first clocking signal and said feedback signal are combined and propagate along a second one of said at least two optical paths; and
      an output coupler for providing a Boolean logic output of an interference between the signals propagating in said at least two optical paths;
    a delay circuit, including at least two optical paths, wherein at least one of said at least two optical paths of said delay circuit includes an optical delay element and wherein an output of said first optical logic circuit is split and propagates along each of said at least two optical paths of said delay circuit;

a second optical logic circuit, including;
   a first input for receiving a signal from a first optical path of said at least two optical paths of said delay circuit;
   a second input for receiving a delayed signal from a second optical paths of said at least two optical paths of said delay circuit, said second optical paths including the delay element;
   at least two optical paths, each of said optical paths of said second optical logic circuit including at least one nonlinear element for imparting an intensity-dependent phase modulation on a combined signal propagating therein, wherein a signal from said first input propagates along a first one of said at least two optical paths of said second logic circuit, and a signal from said third input propagates along a second one of said at least two optical paths of said second logic circuit; and
   an output coupler for providing a Boolean logic output of an interference between the signals propagating in said at least two optical paths of said second logic circuit, and
a feedback path feeding back an output of said second optical logic circuit to said first optical logic circuit for providing said feedback signal.

11. The all-optical linear feedback circuit of claim 10, wherein at least one of said nonlinear elements comprises a semiconductor optical amplifier.

12. The all-optical linear feedback circuit of claim 10, wherein the output coupler of said first optical logic circuit provides an exclusive-NOR Boolean logic output of the combined signals of said at least two optical paths of said first optical logic circuit.

13. The all-optical linear feedback circuit of claim 10, wherein the output coupler of said second optical logic circuit provides an exclusive-OR Boolean logic output of the combined signals of said at least two optical paths of said second optical logic circuit.

14. The all-optical linear feedback circuit of claim 10, wherein the trigger signal initiates the operation of the linear feedback circuit.

15. The all-optical linear feedback circuit of claim 10, wherein at least one of said first optical logic circuit and said second optical logic circuit comprises a Mach-Zehnder Interferometer including at least two arms and an output coupler, wherein each arm includes at least one nonlinear element for imparting an intensity-dependent phase modulation on a combined signal propagating therein.

16. The all-optical linear feedback circuit of claim 10, wherein said optical delay element is implemented for selecting a tap value for said all-optical linear feedback circuit.

17. The all-optical linear feedback circuit of claim 10, wherein said optical delay element comprises an optical phase shifter.

18. The all-optical linear feedback circuit of claim 10, wherein said optical delay element comprises a variable optical delay element.

19. The all-optical linear feedback circuit of claim 10, further comprising a second optical delay element for controlling a total optical path length of said all-optical linear feedback circuit.

20. The all-optical linear feedback circuit of claim 10, further comprising a first optical filter for filtering said trigger signal from an output of said first optical logic circuit.

21. The all-optical linear feedback circuit of claim 10, further comprising a second optical filter for filtering any remaining component of said first clocking signal from an output of said second optical logic circuit.

22. The all-optical linear feedback circuit of claim 10, wherein an output of said all-optical linear feedback circuit provides a $2^N-1$ bit maximal length pseudo-random bit sequence.

23. The all-optical linear feedback circuit of claim 10, wherein the output coupler of said first optical logic circuit provides an AND Boolean logic output of the combined signals of said at least two optical paths of said first optical logic circuit.

24. The all-optical linear feedback circuit of claim 10, wherein said second optical logic circuit further comprises a third input for receiving a second clocking signal to be combined with the signal from said first input in said first one of said at least two optical paths of said second logic circuit, and the signal from said third input in said second one of said at least two optical paths of said second logic circuit.

25. An all-optical linear feedback circuit, comprising:
   a first optical logic means for performing an exclusive-NOR logical operation on at least a clocking signal, an initiating signal and a feedback signal;
   a delay circuit, including at least two optical paths, wherein at least one of said at least two optical paths of said delay circuit includes an optical delay means and wherein an output of said first optical logic means is split and propagates along each of said at least two optical paths of said delay circuit;
   a second optical logic means for performing a logical operation on at least the outputs of said at least two optical paths of said delay circuit; and
   a feedback means for feeding back an output of said second optical logic means to said first optical logic means for providing said feedback signal.

* * * * *